United States Patent
Hashimoto et al.

(10) Patent No.: US 8,384,469 B2
(45) Date of Patent: Feb. 26, 2013

(54) VOLTAGE DIVIDER CIRCUIT AND SEMICONDUCTOR DEVICE

(75) Inventors: Kazuaki Hashimoto, Chiba (JP); Kenji Yoshida, Chiba (JP)

(73) Assignee: Seiko Instruments Inc., Chiba (JP)

( * ) Notice: Subject to any disclaimer, the term of this patent is extended or adjusted under 35 U.S.C. 154(b) by 170 days.

(21) Appl. No.: 13/048,552

(22) Filed: Mar. 15, 2011

(65) Prior Publication Data

US 2011/0227635 A1 Sep. 22, 2011

(30) Foreign Application Priority Data

Mar. 18, 2010 (JP) ................................ 2010-063335

(51) Int. Cl.
*G05F 1/10* (2006.01)
(52) U.S. Cl. ........................................ 327/540; 327/530
(58) Field of Classification Search ................ 327/308, 327/525, 530, 537, 540, 543
See application file for complete search history.

(56) References Cited

U.S. PATENT DOCUMENTS

| | | | | |
|---|---|---|---|---|
| 6,359,428 | B1 * | 3/2002 | Kawamura | 323/369 |
| 6,455,952 | B1 * | 9/2002 | Wang | 307/15 |
| 7,589,581 | B2 * | 9/2009 | Kim | 327/525 |
| 2009/0295462 | A1 | 12/2009 | Itoh | |

FOREIGN PATENT DOCUMENTS

JP 2007-233922 A 9/2007

* cited by examiner

*Primary Examiner* — Jeffrey Zweizig
(74) *Attorney, Agent, or Firm* — Brinks Hofer Gilson & Lione

(57) ABSTRACT

Provided are a voltage divider circuit with high detection precision, a small circuit area, and a reduced chip size, and a semiconductor device including the voltage divider circuit. The voltage divider circuit includes: a first resistor circuit formed to have a resistance that is weighted according to a binary code; a second resistor circuit formed to have a resistance that is weighted according to the same binary code; and a third resistor circuit including a third resistor having a resistance that is weighted according to the same binary code to have a maximum weighted bit count, in which both ends of the third resistor are alternatively connected to an output terminal by two transmission gates.

3 Claims, 2 Drawing Sheets

VOLTAGE DIVIDER CIRCUIT AND SEMICONDUCTOR DEVICE

RELATED APPLICATIONS

This application claims priority under 35 U.S.C. §119 to Japanese Patent Application No. 2010-063335 filed on Mar. 18, 2010, the entire content of which is hereby incorporated by reference.

BACKGROUND OF THE INVENTION

1. Field of the Invention

The present invention relates to a voltage divider circuit in a semiconductor device.

2. Description of the Related Art

A voltage divider circuit formed on a semiconductor integrated circuit needs to be adjusted in resistance by providing an adjustment circuit when there is a fluctuation in resistance due to a manufacturing process or when high precision is required. The resistance is adjusted by trimming using a fuse or the like.

To achieve high precision, however, the adjustment circuit has a larger area and a larger number of resistors, leading to an increased area. There is another problem that the trimming does not result in the same output voltage because a combined resistance of the voltage divider circuit is not constant. To address the problems, there has been developed a technology in which the combined resistance after trimming is kept constant and the number of resistors is reduced (see Japanese Patent Application Laid-open No. 2007-233922).

FIG. 2 illustrates a circuit diagram of a conventional voltage divider circuit. In a voltage divider circuit 1, a first resistor circuit 2 and a second resistor circuit 3 are provided in series between a voltage V1 and a voltage V2 to output a divided voltage V3 from a connection node thereof. Adjustment resistors Ra1 to Ran and adjustment resistors Rb1 to Rbn each have a resistance weighted in binary code. For example, when the adjustment resistor Ra1 has a resistance of K, an arbitrary adjustment resistor Rai (i=1 to n) has a resistance of $K \times 2^{i-1}$. Between the first resistor circuit 2 and the second resistor circuit 3, corresponding resistors have the same resistance. The voltage divider circuit 1 is designed such that a combined resistance of the first resistor circuit 2 and the second resistor circuit 3 after trimming becomes constant ($K \times 7$).

When configured as described above, the voltage divider circuit 1 can always have a constant combined resistance of the first resistor circuit 2 and the second resistor circuit 3 after trimming, and accordingly the necessary numbers of resistors and fuses can be significantly reduced as compared with a conventional voltage divider circuit. Further, in a circuit in which voltage setting is made by varying the resistances, voltage drop due to a resistor does not change, and hence as long as the same voltage is input from the outside, the same voltage can be set even in a constant voltage circuit or a voltage detection circuit having any configuration.

In the above-mentioned voltage divider circuit, however, the two same resistors need to be prepared at a time to keep constant the combined resistance of the first resistor circuit 2 and the second resistor circuit 3 after trimming. Therefore, two resistors with the largest size are necessary as well, which is a disadvantage that the area is increased when the resistance is large.

SUMMARY OF THE INVENTION

The present invention has been made to solve the problem described above, and has an object to realize a voltage divider circuit that has a reduced circuit area and chip size while maintaining the precision of the above-mentioned voltage divider circuit.

In order to solve the conventional problem, a voltage divider circuit according to the present invention has the following configuration.

The voltage divider circuit includes: a first resistor circuit formed to have a resistance that is weighted according to a binary code; a second resistor circuit formed to have a resistance that is weighted according to the same binary code; and a third resistor circuit including a third resistor having a resistance that is weighted according to the same binary code to have a maximum weighted bit count, in which both ends of the third resistor are alternatively connected to an output terminal by two transmission gates.

According to the voltage divider circuit configuration of the present invention, it is possible to reduce the chip size due to the reduced number of elements while maintaining the precision, and also improve cost-effectiveness.

DETAILED DESCRIPTION OF THE PREFERRED EMBODIMENT

Figure 1:
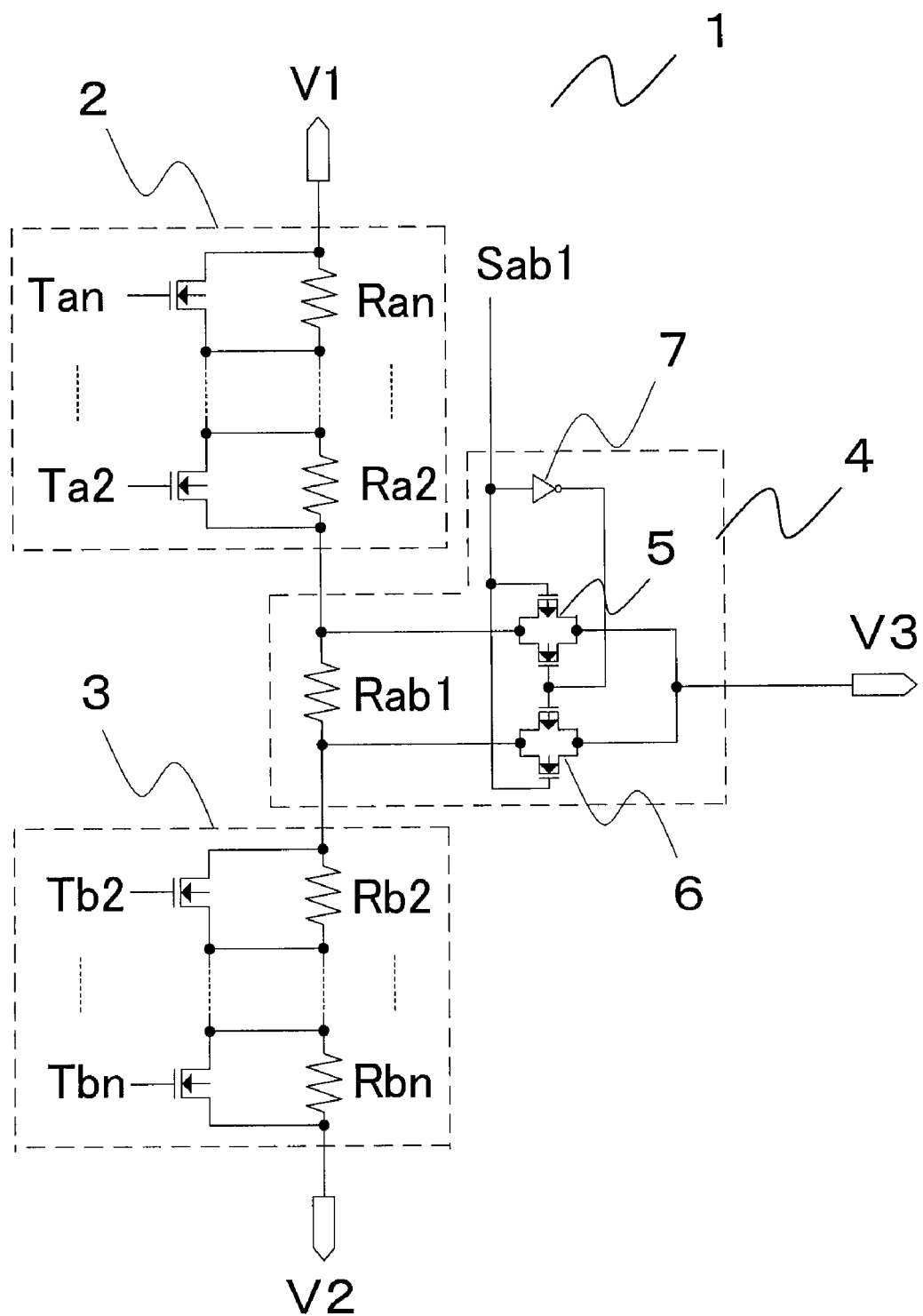
FIG. 1 is a circuit diagram illustrating a voltage divider circuit according to an embodiment of the present invention.

FIG. 1 is a circuit diagram illustrating a voltage divider circuit according to an embodiment of the present invention.

A voltage divider circuit 1 of this embodiment includes a first resistor circuit 2, a second resistor circuit 3, and a third resistor circuit 4. The first resistor circuit 2 includes trimming transistors Ta2 to Tan (n is an integer of n>1) as selection circuits, and resistors Ra2 to Ran. The second resistor circuit 3 includes trimming transistors Tb2 to Tbn as selection circuits, and resistors Rb2 to Rbn. The third resistor circuit 4 includes a resistor Rab1, transmission gates 5 and 6, and an inverter 7. In the voltage divider circuit 1, the first resistor circuit 2, the third resistor circuit 4, and the second resistor circuit 3 are connected in series in this order between a power supply V1 and a power supply V2.

The resistor Rab1 of the third resistor circuit 4, the resistors Ra2 to Ran of the first resistor circuit 2, and the resistors Rb2 to Rbn of the second resistor circuit 3 each have a resistance weighted in binary code. Note that, in contrast to the conventional voltage divider circuit 1 illustrated in FIG. 2, the weighted bit count is increased from the power supply V1 or the power supply V2 toward the third resistor circuit 4, that is, as n is smaller. The first resistor circuit 2 and the second resistor circuit 3 are configured to have the same resistor bit count (for Ra2, ... Ran, Rb2, ... Rbn).

In the third resistor circuit 4, the transmission gates 5 and 6 are connected between one end of the resistor Rab1 and an output V3, and between the other end of the resistor Rab1 and the output V3, respectively. The transmission gates 5 and 6 are alternatively turned on/off by a signal Sab1 and the inverter 7. The resistor Rab1 also has a resistance weighted in binary code, which is larger than Ra2 (Rb2) by 1 bit. Therefore, the resistance of the resistor Rab1 is the largest value.

The above-mentioned voltage divider circuit 1 operates as follows to realize a linear resistance ratio.

In the voltage divider circuit 1, the second resistor circuit 3 is controlled by the trimming transistors Ta2 to Tan and Tb2 to Tbn so as to have the one's complement of the first resistor circuit 2. In other words, the sums of combined resistances used in FIG. 1 are set to be equal to each other. On this occasion, in addition to the resistance ratio between the first resistor circuit 2 and the second resistor circuit 3, the linear resistance ratio can be used by selecting which one of the ends of the third resistor circuit 4 is to be connected to the output V3.

In this case, a resistor used in the first resistor circuit 2 is not used in the second resistor circuit 3 without exception. Therefore, in the conventional voltage divider circuit 1 illustrated in FIG. 2, only one of the resistor Ra1 and the resistor Rb1 is used. The voltage divider circuit 1 of this embodiment has the configuration capable of alternative output from both ends of the resistor Rab1 to the output V3 via the transmission gate 5 or 6. The resistor Rab1 is not used as the resistor Rb1 when used as the resistor Ra1, and is not used as the resistor Ra1 when used as the resistor Rb1. Therefore, the resistor Rab1 having the largest resistance, that is, the largest area is used in common to thereby suppress the increase in area occupied by resistors.

Figure 2:
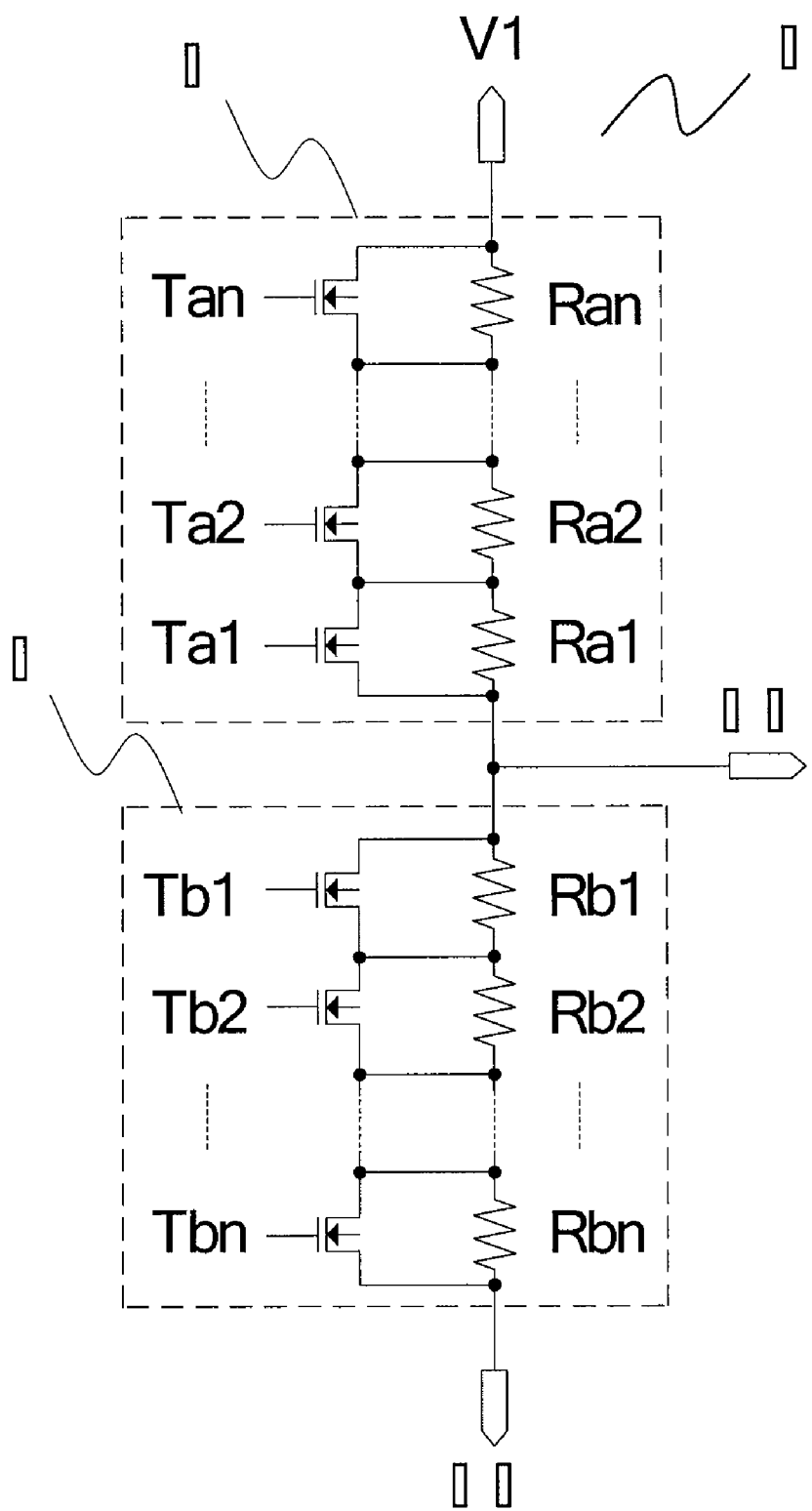
FIG. 2 is a circuit diagram illustrating a conventional voltage divider circuit.

As described above, in the voltage divider circuit 1 according to this embodiment illustrated in FIG. 1, the first resistor circuit 2 and the second resistor circuit 3 use the resistor Rab1 in common to be reduced in bit count by one as compared with the conventional voltage divider circuit 1 illustrated in FIG. 2. The resistor Rab1 is a most significant bit, which means that a resistor having the largest area can be reduced. The transmission gates 5 and 6 and the inverter 7 are logical elements and have less influence on the area, and hence the increase in area can be suppressed. This is more effective as the resistance is larger. Therefore, the chip size of the semiconductor device is reduced to provide an effect of reducing cost.

What is claimed is:
1. A voltage divider circuit, comprising:
a first resistor circuit comprising a first resistor group including:
a plurality of resistors connected in series; and
selection circuits connected in parallel to the plurality of resistors, respectively,
the first resistor group being formed so that the plurality of resistors each have a resistance weighted according to a binary code;
a second resistor circuit comprising a second resistor group including:
a plurality of resistors connected in series; and
selection circuits connected in parallel to the plurality of resistors, respectively,
the second resistor group being formed so that the plurality of resistors each have a resistance weighted according to the binary code; and
a third resistor circuit connected in series between the first resistor circuit and the second resistor circuit, for outputting a divided voltage from an output terminal,
wherein the selection circuits of the first resistor circuit and the selection circuits of the second resistor circuit are selected so that a combined resistance of the first resistor circuit and the second resistor circuit becomes constant,
wherein the third resistor circuit comprises:
a third resistor;
a first transmission gate provided between a connection node of the third resistor and the first resistor circuit, and the output terminal; and
a second transmission gate provided between a connection node of the third resistor and the second resistor circuit, and the output terminal, and
wherein the third resistor has a resistance that is weighted according to the same binary code as the binary codes of the first resistor group and the second resistor group, and has a maximum weighted bit count.
2. A voltage divider circuit according to claim 1, wherein the first transmission gate and the second transmission gate are alternatively selected.
3. A semiconductor device, comprising the voltage divider circuit according to claim 1.

* * * * *